United States Patent [19]
Prabhu et al.

[11] Patent Number: 5,216,207
[45] Date of Patent: Jun. 1, 1993

[54] LOW TEMPERATURE CO-FIRED MULTILAYER CERAMIC CIRCUIT BOARDS WITH SILVER CONDUCTORS

[75] Inventors: Ashok N. Prabhu, East Windsor; Edward J. Conlon, Princeton; Barry J. Thaler, Lawrenceville, all of N.J.

[73] Assignee: David Sarnoff Research Center, Inc., Princeton, N.J.

[21] Appl. No.: 661,264

[22] Filed: Feb. 27, 1991

[51] Int. Cl.$^5$ ............................................. H05K 1/00
[52] U.S. Cl. .................. 174/256; 174/257; 174/258; 106/1.13; 501/21
[58] Field of Search ........... 174/256, 257, 258; 428/901; 106/1.12, 1.13, 1.14, 1.18, 1.19, 20; 252/514, 518; 524/432; 501/2, 6, 20, 21, 26, 32, 48, 59, 76

[56] References Cited

U.S. PATENT DOCUMENTS

| | | | |
|---|---|---|---|
| 4,355,115 | 10/1982 | Hang et al. | 501/21 X |
| 4,733,018 | 3/1988 | Prabhu et al. | 501/20 X |
| 4,748,136 | 5/1988 | Mahulikar | 501/32 |
| 4,772,574 | 9/1988 | Hang et al. | 501/21 |
| 4,808,673 | 2/1989 | Hang et al. | 524/432 X |
| 4,808,770 | 2/1989 | Prabhu et al. | 501/76 X |
| 4,810,420 | 3/1989 | Prabhu et al. | 106/1.13 X |
| 4,816,615 | 3/1989 | Prabhu et al. | 252/512 |
| 4,874,550 | 10/1989 | Prabhu et al. | 106/1.13 X |
| 4,880,567 | 11/1989 | Prabhu et al. | 106/1.18 X |
| 4,997,795 | 3/1991 | Hang et al. | 501/26 X |
| 5,024,883 | 6/1991 | SinghDeo et al. | 428/901 X |

Primary Examiner—Leo P. Picard
Assistant Examiner—Trinidad Korke
Attorney, Agent, or Firm—William J. Burke

[57] ABSTRACT

A novel ceramic green tape composition useful in the manufacture of silver conductor based, low temperature, co-fired multilayer circuit boards comprises from about 8-35% by weight of a calcium-zinc-aluminum-borosilicate devitrifying glass; from about 10-35% by weight of a low alkali borosilicate glass; from about 10-35% by weight of a lead-zinc-aluminosilicate glass; from about 10-35% by weight of a ceramic filler; up to 0.5% by weight of a coloring agent and from about 20-45% by weight of an organic binder. The co-fired multilayer circuit boards made from these green tape compositions have excellent mechanical and electrical properties and have thermal expansion characteristics matching that of silicon.

The devitrifying glass comprises from about 10-30% by weight of zinc oxide; from about 10-20% by weight of calcium oxide; up to about 15% by weight of boron oxide; from about 15-20% by weight of aluminum oxide and about 25-55% by weight of silicon oxide. The lead-zinc-aluminosilicate vitreous glass comprises from about 30-40% by weight of lead oxide, from about 6-12% by weight of zinc oxide, from about 6-10% by weight of aluminum oxide and from about 40-55% by weight of silicon oxide.

Conductor inks can also be made from the above glasses, and mixtures thereof together with a suitable organic vehicle and a conductive metal such as silver.

18 Claims, 7 Drawing Sheets

LOW TEMPERATURE CO-FIRED MULTILAYER CERAMIC CIRCUIT BOARDS WITH SILVER CONDUCTORS

This invention relates to novel ceramic green tape compositions based upon a combination of a devitrifying glass, two vitreous glasses and a ceramic filler, and to low temperature co-fired multilayer circuit boards with silver conductors made therefrom.

BACKGROUND OF THE DISCLOSURE

Co-fired multilayer circuit boards comprise two or more patterned conductor layers separated by a dielectric layer. The patterned conductor layers are connected by metallic conductors deposited in vias in the dielectric layer. The multiple layers are finally fired together to produce very dense circuit patterns.

Modern circuit boards must be able to accommodate complex integrated circuits requiring many input/output connections, and must be able to operate at fast switching speeds and high power levels. Circuit boards having alumina substrates have been developed for these purposes, but alumina requires high sintering temperatures which restrict the choice of conductors to refractory metals, such as tungsten, molybdenum and manganese, which have high electrical resistivities compared to other metals such as silver, copper or gold. Further, refractory metals such as molybdenum and tungsten require gold plating prior to soldering, adding to the cost of these circuit boards. Alumina also has a relatively high dielectric constant, which limits the signal speed. Moreover, alumina substrates have a high thermal coefficient of expansion which is incompatible with that of silicon, so that individual silicon chips or devices cannot form an integral part of the circuit.

Low temperature co-fired multilayer circuit boards made of either devitrifying or vitreous glasses are able to be fired at lower temperatures than alumina, so that other conductive metals can be used, for example silver conductors. Such circuit boards have many advantages for microelectronic packaging applications for the computer, telecommunications and military markets. They have lower shrinkages, low dielectric constants and the ability for direct attachment of silicon devices directly to the co-fired substrate.

However, for certain critical applications, rather stringent requirements are defined for low temperature co-fired circuit boards using silver conductors. They must have a thermal coefficient of expansion of $40\text{-}45 \times 10^{-7}/°$ C. from RT$-400°$ C.; a low dielectric constant at 1 MHz of about 6; resistance to silver migration; a dissipation factor at 1 MHz of less than 0.3%; be laser trimmable without chipping; have a breakdown voltage of more than 40 KV/mm; a specific resistivity of over $10^{14}$ ohm-cm; a flexure strength of about 2000 kg/cm$^{-2}$; a high thermal conductivity of about 0.005 cal/cm-s-° C. and be resistant to chemicals, particularly to acids used as etchants.

In addition, the low temperature co-fired circuit boards must have a firing temperature below about 900° C.; a firing shrinkage of about 13–15% to ensure the production of dense, non-porous substrates; they must be able to be fired in air or nitrogen; and they must be able to form in excess of 15 laminate layers without blistering, delaminating or warping of the layers. Buried silver conductors in the substrates must have a conductivity of less than 6 milliohms/sq. Further, the use of silver conductors requires glasses in the dielectric layers resistant to silver diffusion, to avoid discoloration and staining. These circuit boards must also be low in cost, which is achieved by using silver conductors.

Present day glasses and ceramic circuit boards cannot meet all of these requirements.

SUMMARY OF THE INVENTION

We have formulated certain ceramic green tape formulations for fabricating low temperature, co-fired multilayer ceramic circuit boards with silver conductors using a combination of a novel devitrifying glass, two vitreous glasses and a ceramic filler in an organic vehicle. These green tape compositions are used to form ceramic printed circuit boards having low thermal expansion and dielectric constant characteristics and excellent mechanical and electrical properties by using the laminated co-firing process. The combination of glasses and fillers of the invention can also be used to form buried and via-fill conductor thick film inks compatible with the substrates, that do not form cracks in the multilayer circuit boards during firing.

DETAILED DESCRIPTION OF THE INVENTION

Figure 1:
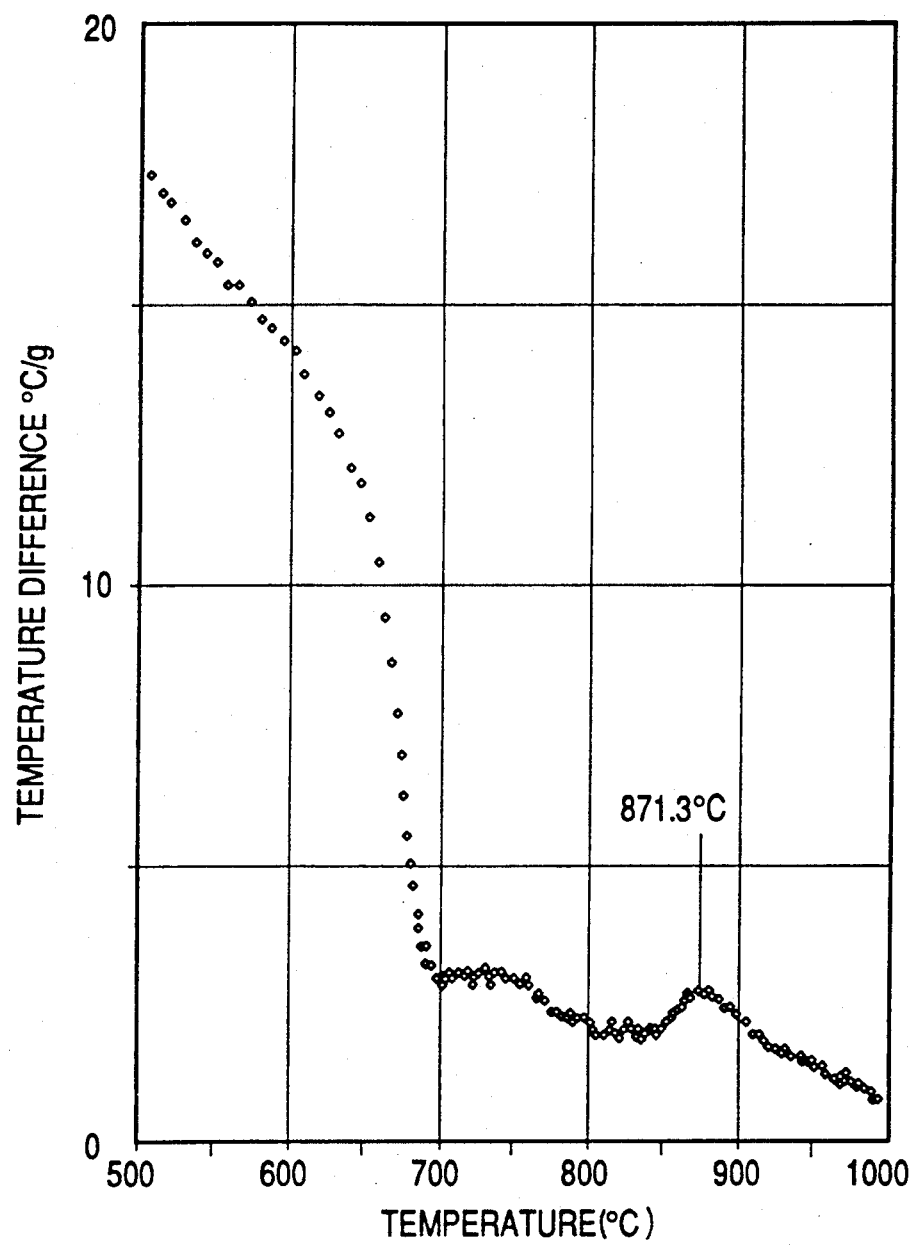
FIGS. 1 and 2 are differential thermal analysis (hereinafter DTA) plots showing the devitrification temperature of glasses of the invention.

The novel green tape formulations of the invention comprise a novel calcium-zinc-aluminum-borosilicate devitrifying glass; two vitreous glasses, a lead-zinc-aluminosilicate glass and a low alkali borosilicate glass, to impart lower expansion and dielectric constant properties to the co-fired substrates and to reduce silver staining; a ceramic filler to improve mechanical and thermal conductivity properties to the co-fired substrate; and an organic vehicle.

The devitrifying glasses of the invention are used to make low temperature co-fired ceramic substrates with silver conductors, using the green tape approach. The devitrifying glass compositions of the invention contain from about 10–30% by weight of zinc oxide (ZnO); from about 10–20% by weight of calcium oxide (CaO); can contain up to about 15% by weight of boron oxide ($B_2O_3$); from about 15–20% by weight of aluminum oxide($Al_2O_3$); and from about 25–55% by weight of silicon dioxide ($SiO_2$). The glasses optionally can also contain small amounts, i.e., up to about 3% by weight, of phosphorus pentoxide and zirconium silicate.

These glasses, when heated to 1000° C., form gahnite ($ZnAl_2O_4$), willemite ($Zn_2SiO_4$) and anorthite ($CaAl_2Si_2O_8$) crystal phases, which have low thermal expansion coefficients. The glasses are also characterized by high softening points and good chemical durability.

The lead-zinc-aluminosilicate vitreous glass compositions contain from about 30–40% (PbO) by weight of lead oxide, from about 6–12% by weight of zinc oxide (ZnO), from about 6–10% by weight of aluminum oxide ($Al_2O_3$) and from about 40–55% by weight of silicon oxide (SiO). These glasses have low thermal expansion coefficients. The devitrifying glass, mixed with two vitreous glasses, a lead-zinc-aluminosilicate glass and a low alkali borosilicate glass, and with a suitable ceramic filler, are admixed with a resin binder, one or more solvents, a plasticizer and a surfactant to form a ceramic slip or green tape composition that can be fired to form a ceramic substrate.

The properties of the ceramic substrates of the invention can be varied depending on the composition and quantities of the various additives. The devitrifying glasses have a number of attractive properties including relatively high vitreous softening temperatures, varied devitrification kinetics, and low thermal expansion coefficients. However, some of the other properties such as flexure strength, dielectric constant, resistance to silver diffusion and laser trimmability are less than satisfactory or marginal.

Since a single vitreous glass cannot overcome all of the deficiencies of the devitrifying glass, the green tape formulations must use a combination of two or more high softening point, low thermal expansion vitreous glasses. One of these glasses helps to lower the dielectric constant and silver staining, whereas the second glass helps to improve flexure strength and laser trimmability. Thus the green tape formulations of the invention combine the devitrifying glass of the invention with various devitrifying and vitreous glasses to vary the properties of the ceramic substrates of the invention. The vitreous glasses, which have high softening points, low dielectric constants, low dissipation factor, low thermal expansion coefficients and good electrical characteristics are added to modify these properties. They are also advantageously added to reduce the staining problem of silver conductors. However, too high an amount of the vitreous glass will reduce the flexure strength of the ceramic. Suitable vitreous glasses include lead-zinc aluminosilicate glasses, and low alkali borosilicate glasses. Additions of ceramic fillers will improve the flexure strength, laser trimmability, dimensional control and thermal conductivity of the co-fired ceramic. Suitable ceramic fillers include alumina ($Al_2O_3$), betaeucryptite ($Li_2Al_2SiO_6$), zirconium dioxide ($ZrO_2$), zirconium silicate (zircon $ZrSiO_4$), zinc silicate ($Zn_2SiO_4$), and calcium aluminosilicate ($CaAl_2Si_2O_8$) powders.

Additionally, particularly when conductive silver thick film inks are to be deposited on the ceramic substrate, a coloring agent such as cobalt oxide ($Co_3O_4$) or chromic oxide ($Cr_2O_3$) can also be included in the green tape composition.

In addition to the devitrifying glasses of the invention, other devitrifying glasses can be added advantageously to the present compositions, including cordierite and willemite-forming glasses.

The organic binder provides strength to the green tape and flexibility and formability to the glass slurry. Suitable binders should have low viscosity, and burn completely at temperatures below about 550° C. Suitable binders are well known and include resins such as polyvinyl butyral, commercially available as Butvar B-98, a trademark of Monsanto Company, and acrylate resins such as the Elvacite resins, a trademark of duPont de Nemours and Company.

The solvent should be compatible with ceramic powders. It acts to solubilize the binder and controls the viscosity of the ceramic suspension. Suitable solvents include one or more of methyl ethyl ketone (hereinafter MEK), ethanol, isopropyl alcohol, toluene, acetone and ethyl acetate.

The plasticizer acts to provide flexibility and compressibility to the green slurry. Suitable plasticizers include a mixture of alkyl benzyl phthalates and alkyl esters and derivatives commercially available as Santicizer 261, a trademark of Monsanto Company.

The surfactant provides surface tension and particle surface charge control of the green slurry and improves dispersability of the binder solution and ceramic suspension. Suitable surfactants include fish oil, such as Kellox-3-Z, a product of Kellog Company, oleylamine, available as Armeen O, or a high molecular weight N-alkyl-1,3-diaminopropane dioleate, available as Duomeen TDO, products of Akzo Chemie America.

The preferred green tape compositions of the invention comprise from about 8–35% by weight of a devitrifying glass, from about 10–35% by weight of a low alkali borosilicate vitreous glass, from about 10–35% by weight of a lead-zinc-aluminosilicate vitreous glass, from about 10–35% by weight of a ceramic filler, up to about 0.5% by weight of a coloring agent and from about 20–45% by weight of an organic binder.

The substrates of the invention are made by first mixing together the inorganic powders, e.g. glasses, filler and coloring agent components, solvent and surfactant, and ball milling for from about 15–60 hours. A premixed batch of solvent, plasticizer and resin binder is then added, and ball milling continued for an additional 1–4 hours. The resultant slurry, or green ceramic, is formed either in a mold, or, when ceramic tape is to be made, by doctor blading onto a polymer tape, such as a polyethylene terephthalate tape, and drying for about one hour. The tape is then ready for screen printing.

Thick film conductor and via fill pastes or inks are known. They must be screen printable to provide conductor lines or pads for the printed circuit and are generally made from a conductive powder in an organic vehicle. The conductive powders of interest herein can be silver, gold, palladium, platinum, copper and mixtures thereof. The conductive powder is mixed with a devitrifying glass of the invention and vitreous glasses to maintain compatibility with the substrates, and optionally with a ceramic filler. The glasses of the invention do not soften below the temperature at which carbonaceous materials such as solvents and binder are pyrolyzed however. The carbonaceous materials burn off first, the devitrifying glass softens and helps densification of the conductor film.

The conductor inks are made by mixing 45–95% by weight of a conductive powder and 5–55% by weight of one or more glasses or a glass and ceramic filler mixture, dispersed in a suitable organic vehicle.

Suitable organic vehicles include a resin binder, a solvent and a surfactant. Suitable resin binders include ethyl cellulose T-100, a product of Hercules Company, hereinafter ECT-100. Other known resin binders include synthetic resins such as polyacrylates, polymethacrylates, polyesters, polyolefins and the like. Suitable solvents are chosen from one or more of pine oil, terpineol, alpha-terpineol, butyl carbitol acetate, 2,2,4-trimethyl-1,3-pentanediol monoisobutyrate, available from Texas Eastman Company under the trademark Texanol, and the like. The vehicles generally contain from about 2 to about 25% by weight of the resin binder. Suitable ink surfactants include Armeen O and Duomeen TDO. The surfactant generally comprises from about 0.2 to about 10% by weight of the organic vehicle.

The conductor inks are made by mixing the conductive metal powder and the glasses and combining with the organic vehicle on a three roll mill that combines mixing and high shearing, to ensure homogeneity of the conductor ink. By controlling the amount of glass, the densification characteristics of the conductors can be matched to the shrinkage characteristics of the substrates.

Via fill conductor inks are made from powdered conductive metal and relatively larger amounts of a glass of the invention which can be mixed with a filler, and with the vitreous glasses and an organic vehicle as described above for the conductor inks. The via fill conductor inks of the invention, when incorporated into co-fired circuit boards of the invention having upwards of six layers, do not show any dielectric cracking around via holes, indicating a good thermal expansion match of the via fill conductor films and the dielectric layers.

Co-fired multilayer printed substrates are formed by uniformly cutting the green tapes, blanking the tapes to form registration holes, punching to form via holes, screen printing to form conductor lines and to connect the various circuit patterns together, and laminating a stack, e.g., 2 or more screen printed tape substrates, by heating under compression. The resultant laminated stack is prefired to remove the organics and fired at temperatures of about 850° C. when the devitrifying and vitreous glasses will flow and the devitrifying glasses will crystallize, forming a monolithic multilayered ceramic circuit board. The circuit boards of the invention undergo a significant amount of shrinkage during the firing step to achieve a substrate free of excessive porosity, reducing or eliminating the silver staining problem.

Figure 7:
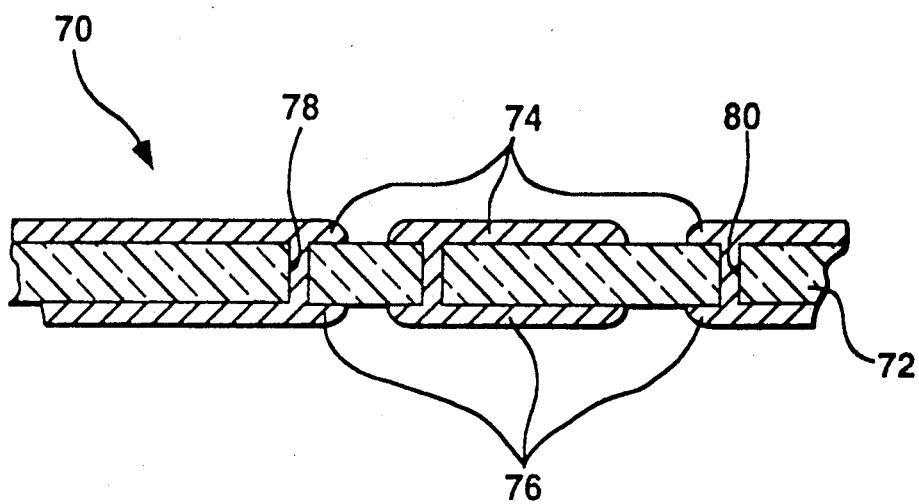
FIG. 7 is a cross sectional view of a portion of a multilayered printed circuit board of the invention.

FIG. 7 is a cross sectional view of a portion of a multilayer printed circuit board 70. A ceramic dielectric layer 72 of the invention has a first patterned conductive layer 74 on one side thereof and a second patterned conductive layer 76 on the opposite side thereof. Vias 78 and 80 filled with conductive material connect the conductive layers 74 and 76.

The silver conductor based multilayer co-fired ceramic substrates of the invention are blister free, pinhole free and warp free and do not present delamination problems. Silver staining is minimized by adjusting the glass content of a mixture of devitrifying and vitreous glasses. Similarly, the dielectric constant, laser trimmability and flexure strength are also optimized by using a combination of a devitrifying glass, two vitreous glasses and a ceramic filler. The fired substrates of the invention meet or exceed the requirements for shrinkage, resistivity, thermal coefficient of expansion, dielectric constant, dissipation factor, breakdown voltage, specific resistivity, flexure strength, hermeticity, acid resistance, laser trimmability and resistance to silver migration.

The invention will be further illustrated in the following Examples. In the Examples, parts and percentages are by weight. Various tests were made to characterize the various glasses and fired layers.

Devitrification temperature, DT, was determined by DTA and is taken as the peak temperature.

Thermal coefficient of expansion, TCE, was determined by pressing the glass powders into bars, firing to 900° C., and determining the coefficient of expansion $\times 10^{-7}/°$ C. versus temperature.

Flexure strength was measured using co-fired substrates about 1.5–3 inches long, 0.3–0.5 inch wide and 0.04–0.08 inch thick by a three point bend test on an Instron Universal tester.

The co-fired substrates were also laser trimmed using a YAG laser, 2.5 KW, 5 mm/sec and examined using optical and scanning electron microscopy for detecting dielectric chipping or other irregularities. The designation "very good" (VG) means no chipping was detected and "good" means a small degree of chipping was observed. A larger degree of chipping would be designated as "difficult to trim". Other results are presented on a scale of 1–5 where "5" is very good.

Shrinkage is determined by measuring sample dimensions after laminating and firing at a peak temperature of 850° C. in a belt furnace.

Dielectric constant and dissipation factor in percent was measured at 1 MHz and 10 KHz on co-fired substrates using silver electrodes. Capacitance was measured as $10^{-12}$ farad.

Resistance to silver migration was determined by printing silver electrodes on the top dielectric layer which is connected to an electrode on the second layer, inserting co-fired substrates in a humidity chamber at 60° C., 90% RH while maintaining a 48 v DC bias on the electrodes. After 60–80 hours the substrate is removed, the bulk resistance measured using an electrometer, and the sequence repeated up to 1000 hours. The tapes measured had a resistance of $>10^{10}$ ohms after 1000 hours, well above the requirement of $10^9$ ohms.

Hermeticity of co-fired substrates was measured using a lead attached to a silver electrode and monitoring the leakage current (1M NaCl solution, 10 V DC bias).

Dielectric bulk resistance of co-fired substrates was measured using an electrometer. The resistance values were taken after 5 minutes.

Visual examination and optical microscopy were used to evaluate dielectric-silver compatibility. A poor silver-dielectric compatibility can lead to either warping of the co-fired circuit boards and/or an adverse interaction at the silver-dielectric interface leading to opens in the silver conductors.

EXAMPLES 1–4

Preparation of Calcium-Zinc-Aluminum-Borosilicate Devitrifying Glasses

The following oxides were mixed on a two roll mill for 3–4 hours, melted at 1600°–1620° C., quenched on a two roll mill and ground to pass through a 105 mesh sieve. The glass particles were milled in isopropanol for 23 hours, the solvent removed over boiling water and the glass baked by heating in oxygen to 550° C. for about 7 hours to remove the organics. The compositions are summarized below in Table I.

TABLE I

| Constituent | Ex. 1 | Ex. 2 | Ex. 3 | Ex. 4 |
|---|---|---|---|---|
| ZnO | 14.22 | 14.22 | 26.67 | 26.67 |
| CaO | 14.22 | 14.22 | 13.33 | 13.33 |
| Al$_2$O$_3$ | 17.98 | 17.98 | 17.78 | 17.78 |
| B$_2$O$_3$ | — | 4.44 | 13.33 | 6.67 |
| SiO$_2$ | 53.58 | 49.14 | 28.89 | 35.55 |
| DT, °C. | 950 | | 871.3* | 857.5** |

TABLE I-continued

| Constituent | Ex. 1 | Ex. 2 | Ex. 3 | Ex. 4 |
|---|---|---|---|---|
| TCE, ppm/°C. @400° | | | 5.2*** | 3.2**** |

Figure 2:
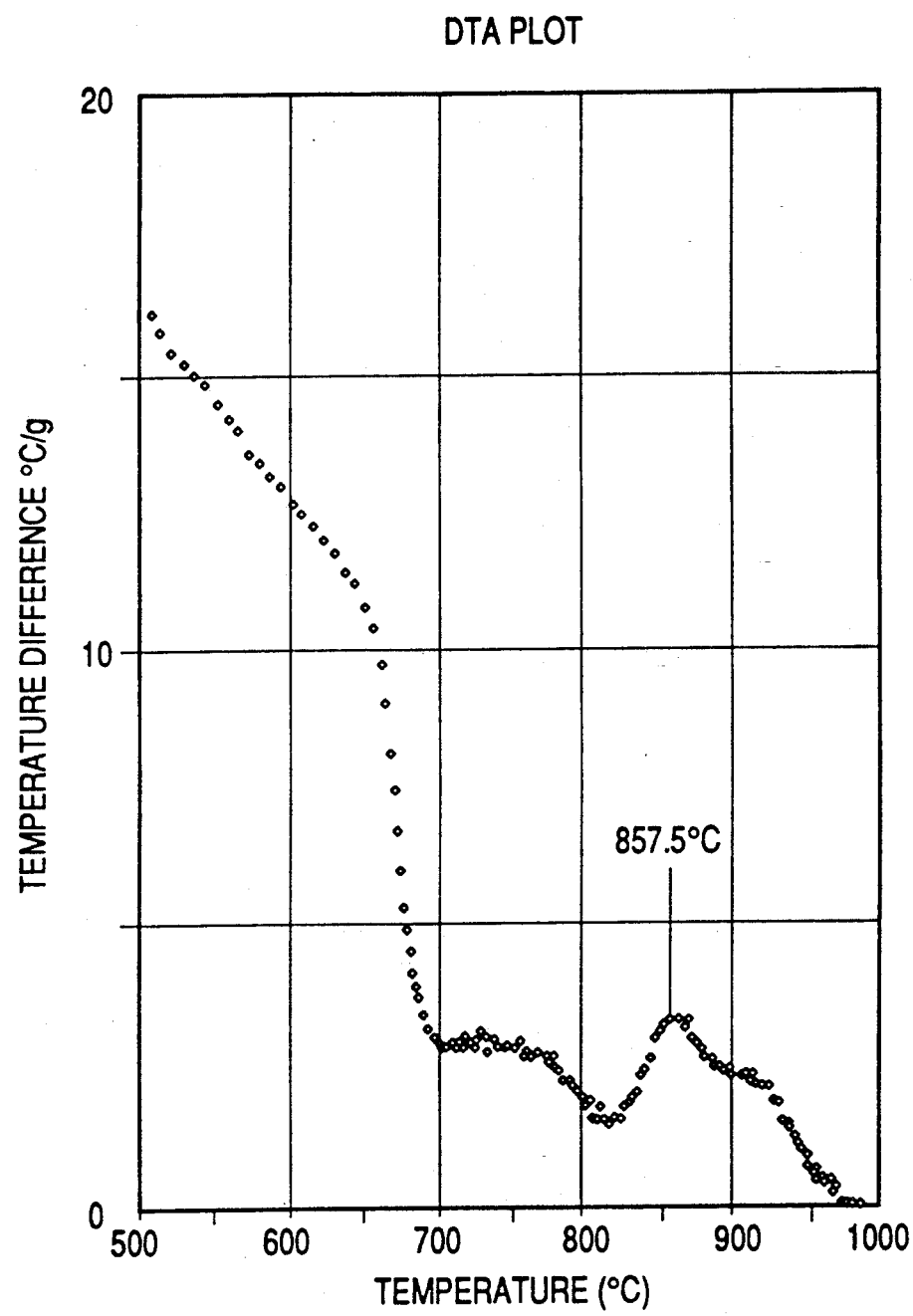
Figure 3:
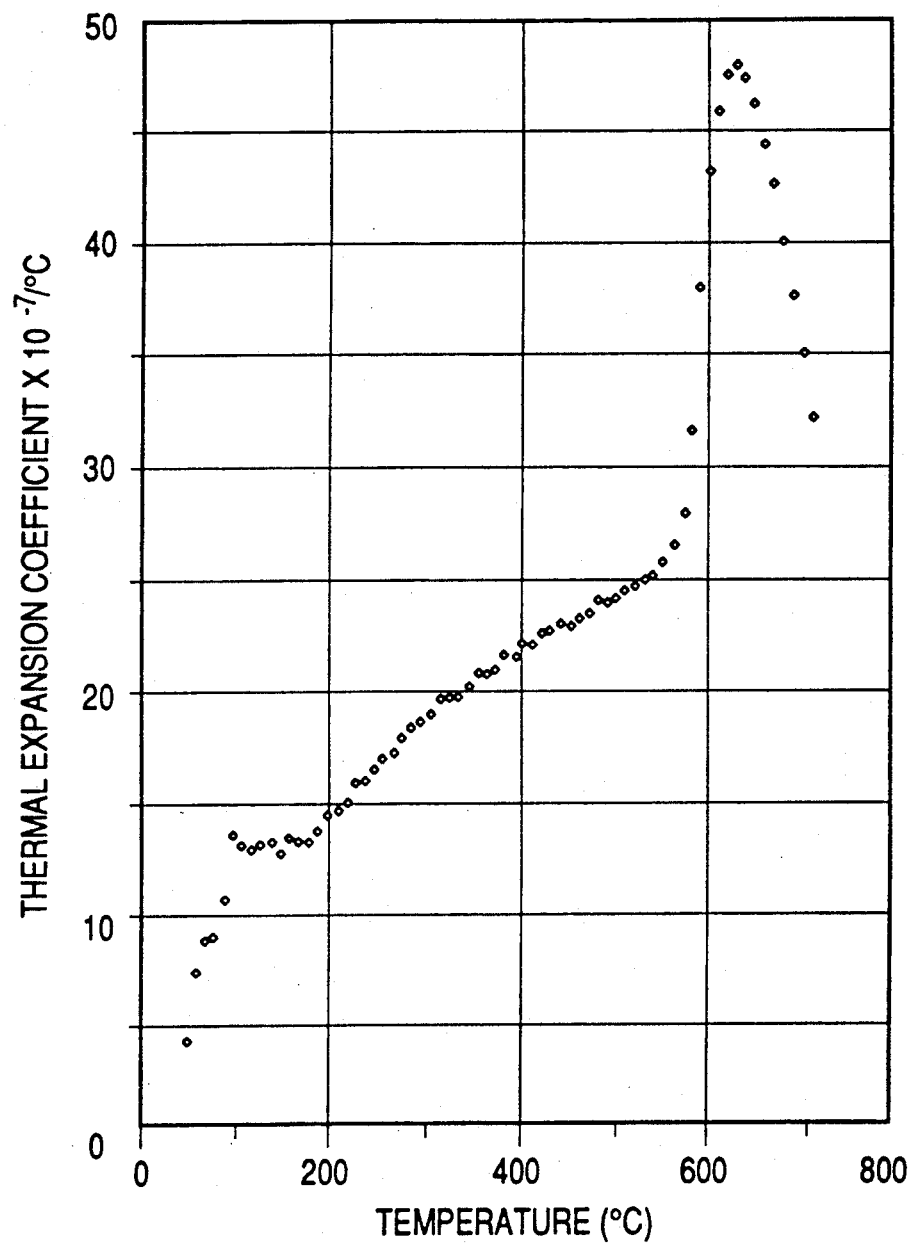
FIGS. 3, 4, 5 and 6 are thermal coefficient of expansion plots at various temperatures of glasses and green tape compositions of the invention.
Figure 4:
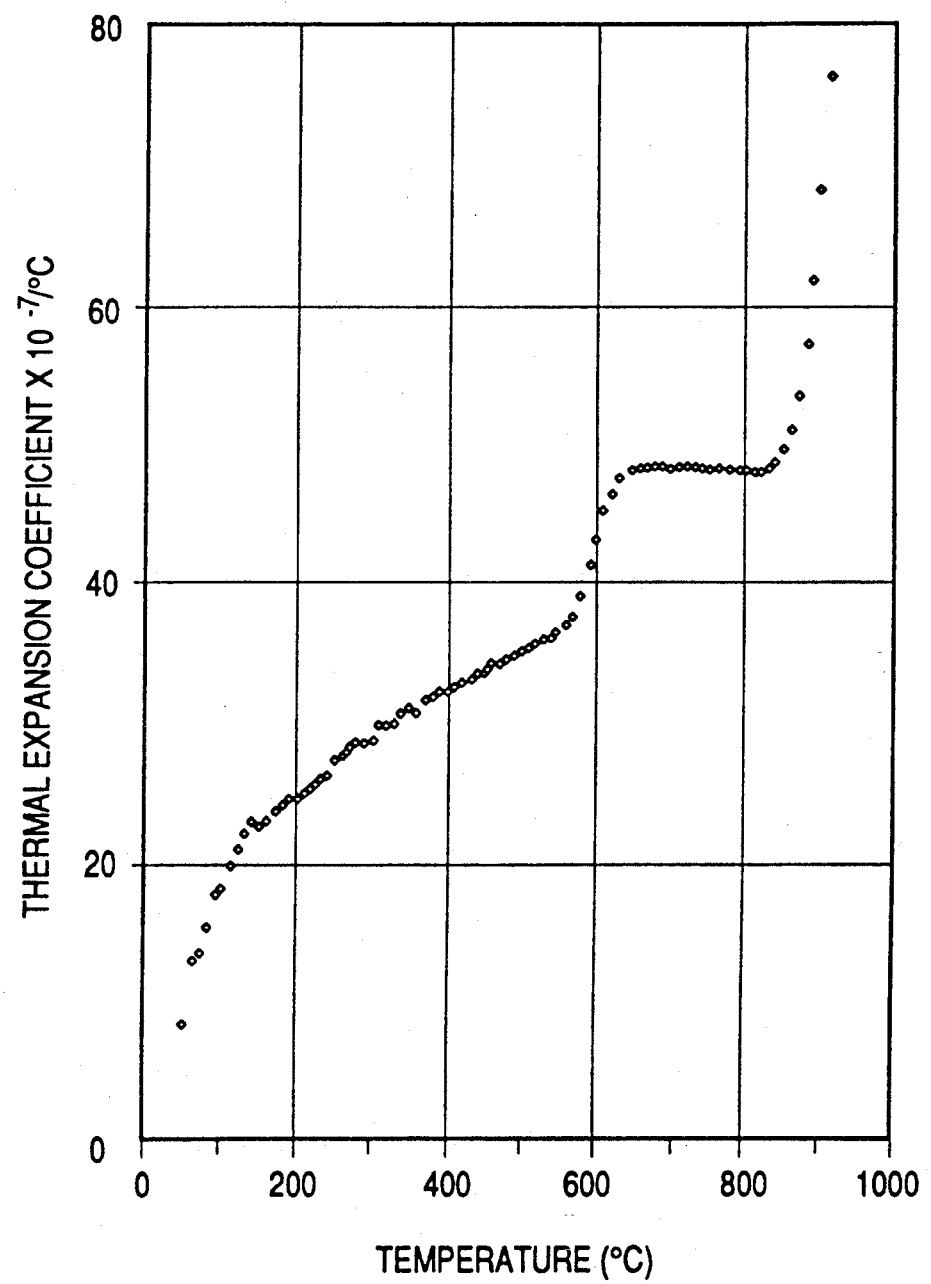

*See FIG. 1
**See FIG. 2
***See FIG. 3
****See FIG. 4

The glasses, when fired at 1000° C., have crystal phases of the gahnite ($ZnAl_2O_4$), willemite ($Zn_2SiO_4$) and anorthite ($CaAl_2Si_2O_8$) type.

Preparation of Lead-Zinc-Aluminosilicate Vitreous Glasses

The following vitreous lead and zinc-containing borosilicate glasses were prepared, as summarized below in Table II. Glass D was purchased as glass 7070 from Corning Glass Works. It is a low alkali borosilicate glass.

| Constituent | Glass A | Glass B | Glass C | Glass D |
|---|---|---|---|---|
| PbO | 35.55 | 33.33 | 35.55 | |
| ZnO | 8.00 | 8.00 | 10.22 | |
| $Al_2O_3$ | 8.00 | 8.00 | 8.00 | |
| $SiO_2$ | 48.45 | 50.67 | 6.23 | |
| TCE, ppm/°C. @400° | | | 22.00** | 32.00* |
| Dielectric Constant (10 KHz) | | | 7.8 | 4.1 |

Figure 5:
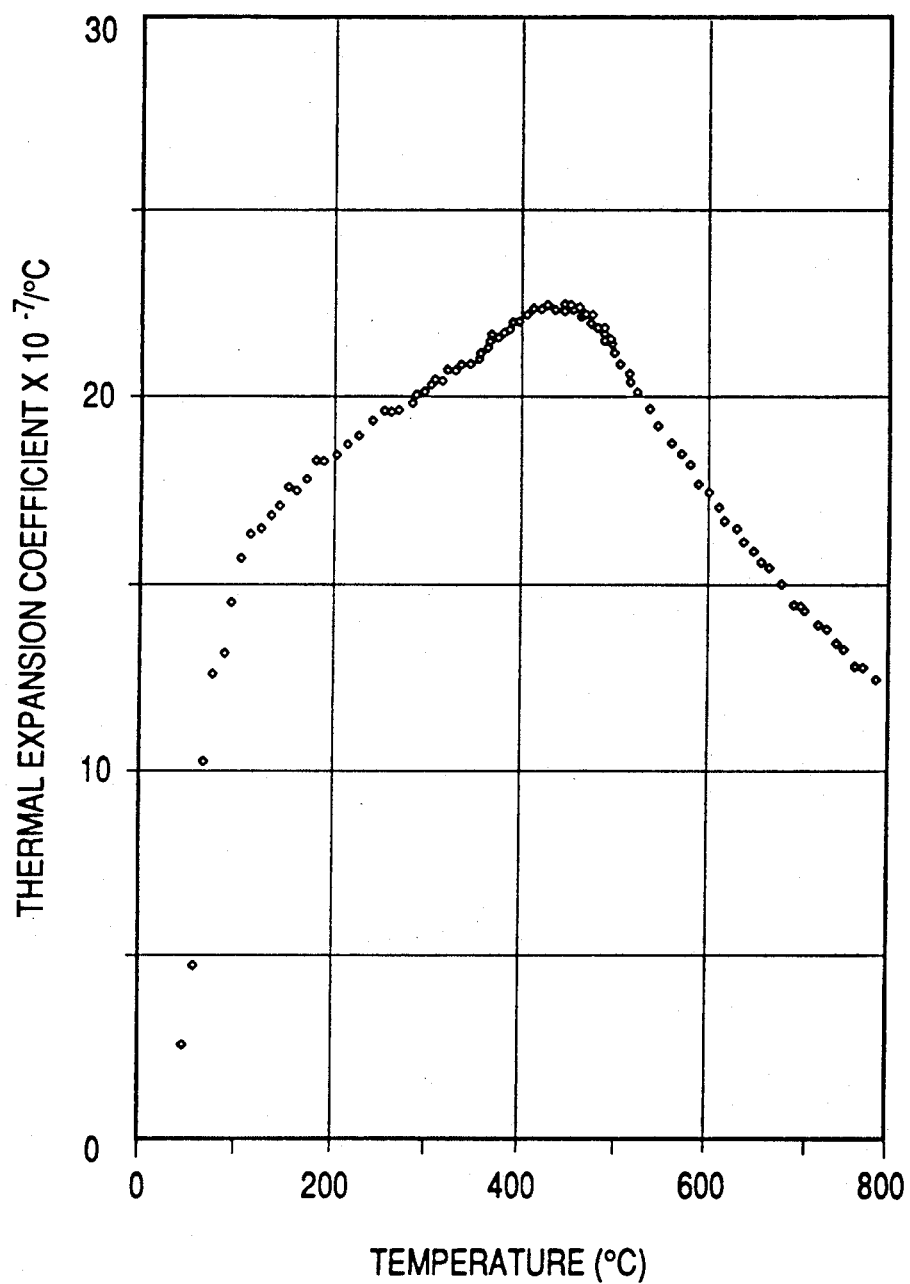

*@300° C.
**See FIG. 5

TABLE III

| | % by weight | |
|---|---|---|
| Constituent | Example 5 | Example 6 |
| Glass of Example 1 | 62.32 | |
| Glass of Example 3 | | 62.31 |
| MEK | 15.58 | 15.58 |
| fish oil | 0.68 | 0.68 |
| resin binder | 21.42 | 21.42 |
| Flexure Strength (kg/cm2) | 1461 | 299 |
| Hermeticity (amp) | $10^{-9}$ | $10^{-8}$ |
| Dissipation Factor, 10 KHz | 0.3 | 0.1 |
| Dielectric Constant, 10 KHz | — | 7.3 |

The dielectric breakdown strength of the tape of Example 5 was measured by increasing the voltage on the sample at 500 V increments up to a maximum of 5 KV. No failure was noted up to 5 KV on 0.005 inch thick layers, indicating a dense microstructure of the co-fired substrate. However, high dielectric constant, silver staining and laser trimmability are still problems with these compositions.

EXAMPLES 7–12

Preparation of Green Tape Compositions from Devitrifying Glass and Borosilicate Glass The following green tape compositions were made according to Example 5 but mixing the glasses of the invention with a low alkali borosilicate glass and a ceramic filler, optionally with a coloring agent. The compositions and test data are summarized below in Table IV.

TABLE IV

| Constituent | Ex. 7 | Ex. 8 | Ex. 9 | Ex. 10 | Ex. 11 | Ex. 12 |
|---|---|---|---|---|---|---|
| Glass of Example 1 | 19.86 | | 11.90 | 14.42 | 9.43 | |
| Glass of Example 2 | | 23.14 | | | | |
| Glass of Example 3 | | | | | | 14.29 |
| Glass D | 31.78 | 23.14 | 34.03 | 24.04 | 23.58 | 19.05 |
| zircon | 11.92 | | 16.88 | | | |
| alumina | | 15.43 | | | | |
| zirconium oxide | | | | 22.60 | 26.89 | 27.14 |
| $Cr_2O_3$ | — | — | 0.5 | 0.48 | 0.47 | 0.47 |
| MEK | 13.90 | 16.39 | 6.94 | 16.34 | 17.92 | 17.14 |
| fish oil | 0.70 | 0.68 | 0.79 | 0.96 | 0.94 | 0.95 |
| resin binder | 21.84 | 21.22 | 21.83 | 21.16 | 20.77 | 20.96 |
| isopropanol | | | 7.13 | | | |
| TCE @400° C. | 70 | 38 | 38 | — | 46 | — |
| Flexure Strength (kg/cm2) | 1824 | 1611 | 1723 | 2181 | 1706 | 2012 |
| High speed Laser trimmability | | | 1.0 | 4 | 5 | 4 |
| Silver-dielectric compatibility | | | | poor | poor | poor |

EXAMPLES 5–6

Preparation of Green Tape Compositions from Devitrifying Glasses Alone

Green tape compositions were prepared from the glasses of Examples 1–4 by mixing together with a solvent (MEK) and surfactant (fish oil) and ball milling for 10–60 hours. A premixed resin, plasticizer and solvent formulation (consisting of 15% by weight of polyvinyl butyral, B-98, 10% by weight of benzyl alkyl phthalate, S-261 and 75% by weight of ethanol) was added and ball milling continued for two to four more hours. The compositions and test data are summarized in Table III below:

Thus the above compositions still do not meet all of the requirements for co-fired multilayer circuit boards.

EXAMPLES 13–18

Preparation of Green Tape Compositions from Devitrifying Glass and Lead-Zinc-Aluminosilicate Vitreous Glass The following green tape compositions were made following the procedure of Examples 5–6 but combining the glasses of Examples 1–4 with a lead-zinc-aluminosilicate glass and optionally a filler. The compositions and the test data are summarized below in Table V.

TABLE V

| Constituent | Ex. 13 | Ex. 14 | Ex. 15 | Ex. 16 | Ex. 17 | Ex. 18 |
|---|---|---|---|---|---|---|
| Glass of Example 1 | | | | | | |
| Glass of Example 3 | 24.29 | | 28.00 | 21.50 | 19.70 | |
| Glass of Example 4 | | 32.99 | | | | 27.69 |
| Glass A | 24.29 | | 24.00 | 16.50 | 8.37 | |
| Glass B | | 32.99 | | | | 27.69 |
| alumina | 16.19 | | 11.50 | 25.50 | | 9.74 |
| zirconium ozide | | | | | 34.48 | |
| $Cr_2O_3$ | — | | 0.5 | 0.5 | 0.49 | 0.51 |
| MEK | 7.08 | 16.49 | 15.00 | 12.00 | 15.78 | 16.43 |
| fish oil | 0.81 | 1.04 | 1.00 | 2.00 | 1.48 | 1.02 |
| resin binder | 18.22 | 16.49 | 20.00 | 22.00 | 19.70 | 16.92 |
| isopropanol | 9.12 | | | | | |
| TCE @400° C. | 51 | | | 37 | | |
| Flexure strength (kg/cm2) | 1750 | | | | | |
| Silver-dielectric compatibility | — | — | — | good | very good | |
| Dielectric constant | | 7.6 | | | | 8.8 |

These formulations, containing the lead-zinc-aluminosilicate glass, have high dielectric constants.

EXAMPLES 19-24

Preparation of Green Tape Compositions from Devitrifying Glass and Mixtures of Lead-Zinc-Aluminosilicate and Low Alkali Borosilicate Glasses Green tape compositions were prepared following the procedure of Example 5 using the glass of Example 3 mixed with two vitreous glasses and a ceramic filler. The compositions and test data are summarized below in Table VI.

TABLE VI

| Constituents | Ex. 19 | Ex. 20 | Ex. 21 | Ex. 22 | Ex. 23 | Ex. 24 |
|---|---|---|---|---|---|---|
| Glass of Example 3 | 11.32 | | 15.15 | 12.31 | 12.31 | 14.15 |
| Glass of Example 4 | | 12.18 | | | | |
| Glass D | 18.87 | 20.30 | 16.16 | 16.41 | 16.41 | 18.87 |
| Glass A | 12.26 | | | | | 9.43 |
| Glass B | | 32.49 | | | | |
| Glass C | | | 11.11 | 14.36 | 13.33 | |
| alumina | 17.45 | | 22.02 | 22.36 | 23.38 | 17.45 |
| $Cr_2O_3$ | 0.47 | | 0.2 | 0.21 | 0.21 | 0.47 |
| MEK | 19.81 | 16.75 | 17.17 | 16.92 | 16.92 | 19.81 |
| fish oil | 1.88 | 1.02 | 1.02 | 1.02 | 1.02 | 1.88 |
| resin binder | 17.94 | 17.26 | 17.17 | 16.41 | 16.42 | 17.94 |
| TCE @400° C. | 42* | | 43 | 47 | 49 | |
| Flexure Strength (kg/cm2) | — | | 2022 | 2472 | 2216 | |
| Laser trimmability | VG | | VG | VG | VG | |
| Hermeticity (amp). | $<10^{-9}$ | | | | | $>10^{-9}$ |
| Acid Resistance** (amp) | $<10^{-9}$ | | | | | $<10^{-9}$ |
| Dielectric Constant @1 MHz | 6.33 | 5.4 | 6.93 | 7.12 | 7.07 | 5.8 |
| Dissipation Factor @1 MHz, % | 0.36 | 0.16 | 0.27 | 0.30 | 0.29 | 0.4 |
| Dielectric Breakdown Strength @5KV | | | | no fail | | |
| Dielectric specific resistivity, ohm-cm | $>2 \times 10^{14}$ | | | | | $>10^{14}$ |
| Silver-dielectric compatibility | good | | good | good | good | |

Figure 6:
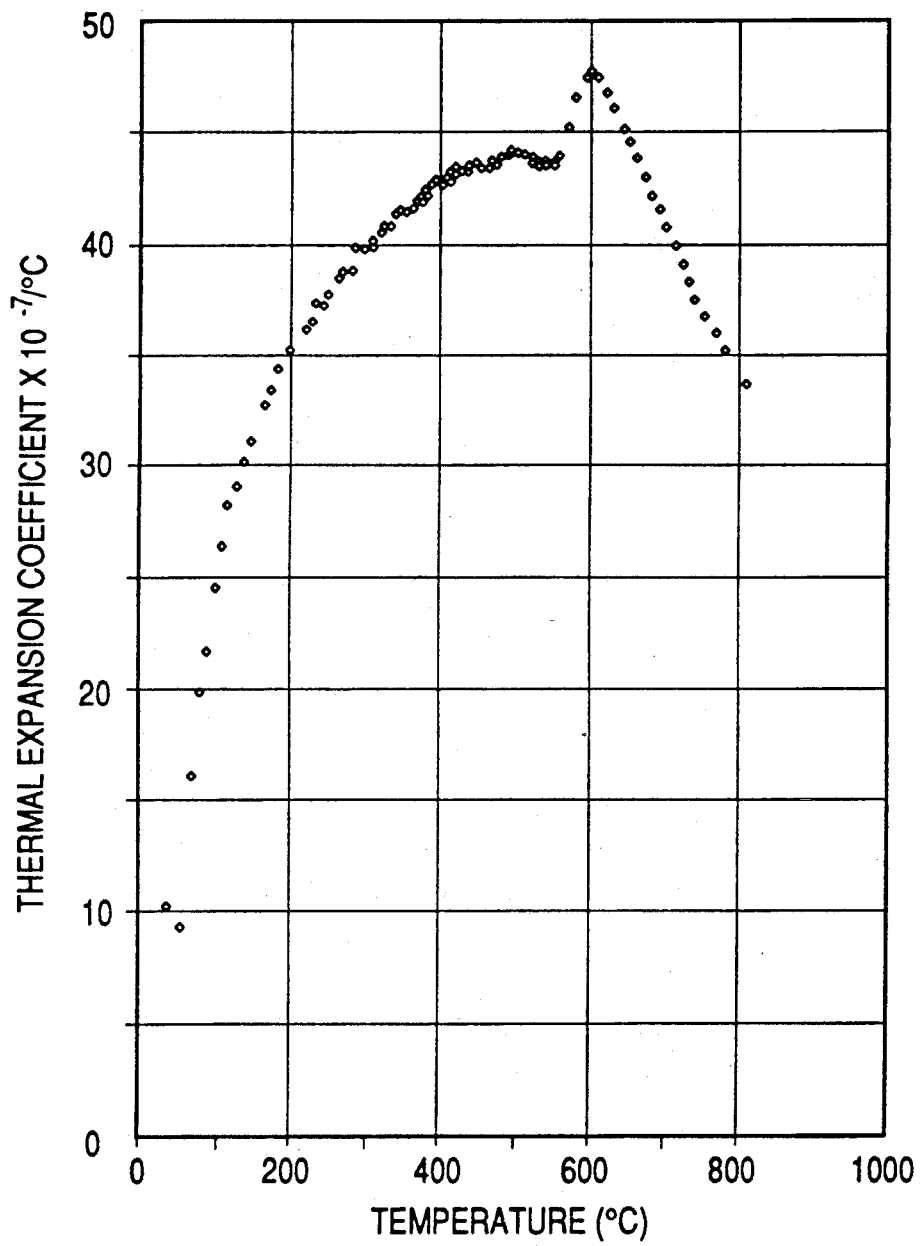

*See FIG. 6
**Acid resistance was measured by treating the test sample after hermeticity testing in 2% HF solution at 35-40° C. for one-half minute three times, when the hermeticity test was repeated.

The thermal conductivity of Example 24 was measured by electroding a co-fired substrate with silver ink, tinning with lead-tin solder and attaching to a copper block. Thermal conductivity was determined using a thin film silicon heater by measuring temperature difference. The thermal conductivity was 0.005 cal/sec-cm-°C. and is higher than most glasses.

EXAMPLES 25-29

Preparation of Buried Conductor Inks and Via Fill Inks

Silver powder, glass powder and an organic vehicle were combined on a three roll mill. The compositions are summarized below in Table VII, wherein Examples 28 and 29 are intended primarily as via fill inks.

TABLE VII

| Constituent | Ex. 25 | Ex. 26 | Ex. 27 | Ex. 28 | Ex. 29 |
|---|---|---|---|---|---|
| Glass of Example 3 | 3.69 | 7.38 | 11.07 | 7.38 | 3.69 |
| Silver powder | 70.11 | 66.42 | 62.73 | 44.28 | 59.04 |
| Alumina | | | | 7.38 | 3.69 |
| 5% T-100 in terpineol | 11.07 | 11.07 | 11.07 | 11.07 | 11.07 |
| Terpineol | 14.76 | 14.76 | 14.76 | 14.76 | 14.76 |
| Duomeen TDO | 0.37 | 0.37 | 0.37 | 0.37 | 0.37 |
| Glass D | | | | 7.38 | 3.69 |
| Glass C | | | | 7.38 | 3.69 |

Preparation of Multiple Layer Substrates

The conductor inks as prepared in Examples 25–27 were screen printed onto ceramic tape as prepared in Examples 19–24 which had been separated from the polymer tape backing, blanked for registration holes and vias punched. Several screen printed tapes were dried and then stacked and laminated in a lamination die by preheating at 100° C. for 15–30 minutes, and compressed at 3000 psi for 5–30 minutes. The stack was cooled and prebaked at 525° C. and fired at 850° C. in a belt furnace, employing a two hour cycle holding the peak temperature for from 20–40 minutes. No delamination, dielectric cracking or silver staining was noted.

We claim:

1. In a low temperature co-fired multilayer ceramic circuit board comprising two or more patterned conductor layers of a conductive metal selected from the group consisting of silver, gold, copper, palladium and platinum and mixtures thereof in a glass matrix, said layers being separated by a dielectric layer having vias therein filled with conductive material to contact said conductive layers for connection to said conductive metal layers, the improvement which comprises employing as said dielectric layer a composition comprising a combination of a calcium-zinc-aluminum-borosilicate devitrifying glass, a low alkali borosilicate vitreous glass, a lead-zinc-aluminosilicate vitreous glass and a ceramic filler.

2. A multilayer ceramic circuit board according to claim 1 wherein the devitrifying glass comprises from about 10–30% by weight of zinc oxide, from about 10–20% by weight of calcium oxide, up to about 15% by weight of boron oxide, from about 15–20% by weight of aluminum oxide and from about 25–55% by weight of silicon oxide.

3. A multilayer ceramic circuit board according to claim 1 wherein the lead-zinc-aluminosilicate vitreous glass comprises from about 30–40% by weight of lead oxide, from about 6–12% by weight of zinc oxide, from about 6–10% by weight of aluminum oxide and from about 40–55% by weight of silicon oxide.

4. A multilayer ceramic circuit board according to claim 1 wherein said conductive metal is silver.

5. A multilayer ceramic circuit board according to claim 1 wherein said ceramic filler is selected from the group consisting of alumina, zircon and zirconium oxide.

6. A conductor ink for multilayer integrated circuit boards comprising a glass composition and a conductive metal selected from the group consisting of silver, gold, copper, palladium, platinum and mixtures thereof in an organic vehicle, wherein said glass composition comprises a calcium-zinc-aluminum-borosilicate devitrifying glass composition, a low alkali borosilicate vitreous glass, a lead-zinc-aluminosilicate vitreous glass and a ceramic filler.

7. A conductor ink according to claim 6 wherein the devitrifying glass comprises from about 10–30% by weight of zinc oxide, from about 10–20% by weight of calcium oxide, up to about 15% by weight of boron oxide, from about 15–20% by weight of aluminum oxide and from about 25–55% by weight of silicon oxide.

8. A conductor ink according to claim 6 wherein the lead-zinc-aluminosilicate vitreous glass comprises from about 30–40% by weight of lead oxide, from about 6–12% by weight of zinc oxide, from about 6–10% by weight of aluminum oxide and from about 40–55% by weight of silicon oxide.

9. A conductor ink according to claim 6 wherein said conductive metal is silver.

10. A conductor ink according to claim 6 wherein said ceramic filler is selected from the group consisting of alumina, zircon, zirconium oxide and zinc silicate.

11. A green tape composition comprising a combination of a calcium-zinc-aluminum-borosilicate devitrifying glass, a low alkali borosilicate vitreous glass, a lead-zinc-aluminosilicate vitreous glass and a ceramic filler in an organic vehicle.

12. A green tape composition according to claim 11 additionally containing a coloring agent.

13. A green tape composition according to claim 11 comprising from about 8–35% by weight of a devitrifying glass, from about 10–35% by weight of a low alkali borosilicate vitreous glass, from about 10–35% by weight of a lead-zinc-aluminosilicate vitreous glass, from about 10–35% by weight of a ceramic filler, up to about 0.5% by weight of a coloring agent and from about 20–45% by weight of an organic binder.

14. A green tape composition according to claim 11 wherein the devitrifying glass comprises from about 10–30% by weight of zinc oxide, from about 10–20% by weight of calcium oxide, up to about 15% by weight of boron oxide, from about 15–20% by weight of aluminum oxide and from about 25–55% by weight of silicon oxide.

15. A green tape composition according to claim 11 wherein said lead-zinc-aluminosilicate vitreous glass comprises from about 30–40% by weight of lead oxide, from about 6–12% by weight of zinc oxide, from about 6–10% by weight of aluminum oxide and from about 40–55% by weight of silicon oxide.

16. A green tape composition according to claim 11 wherein said ceramic filler is selected from the group consisting of alumina, zircon, zirconium oxide and zinc silicate.

17. A green tape composition according to claim 11 wherein said organic vehicle is a combination of a polyvinyl butyral resin, an alkyl benzyl phthalate plasticizer, ethanol and methyl ethyl ketone solvents and a fish oil surfactant.

18. A devitrifying glass composition comprising the following oxides on a weight basis: from about 10–30% of zinc oxide, from about 10–20% of calcium oxide, up to about 15% of boron oxide, from about 15–20% of aluminum oxide and from about 25–55% of silicon oxide.

* * * * *